United States Patent [19]

Torizuka et al.

[11] Patent Number: 4,693,955

[45] Date of Patent: Sep. 15, 1987

[54] NEGATIVE TYPE LITHOGRAPHIC PRINTING PLATE

[75] Inventors: Koichi Torizuka; Kiyoshi Futaki, both of Nagaokakyo, Japan

[73] Assignee: Mitsubishi Paper Mills, Ltd., Tokyo, Japan

[21] Appl. No.: 712,731

[22] Filed: Mar. 18, 1985

[30] Foreign Application Priority Data

Mar. 19, 1984 [JP] Japan .................................. 59-54089
Jan. 28, 1985 [JP] Japan .................................. 60-15039

[51] Int. Cl.$^4$ .......................... G03C 5/54; G03C 1/06
[52] U.S. Cl. .................................... 430/204; 430/230; 430/234; 430/564; 430/415; 430/416; 430/955; 430/251
[58] Field of Search ............... 430/251, 204, 205, 955, 430/234, 227, 415, 416, 230

[56] References Cited

U.S. PATENT DOCUMENTS

| | | | |
|---|---|---|---|
| 3,685,991 | 8/1972 | Grasshoff et al. | 430/251 |
| 4,199,355 | 4/1980 | Hinshaw et al. | 430/234 |
| 4,247,617 | 1/1981 | Debruyn et al. | 430/233 |
| 4,297,430 | 10/1981 | Kanada et al. | 430/234 |
| 4,299,908 | 10/1981 | Ito et al. | 430/251 |
| 4,499,181 | 2/1985 | Watanabe et al. | 430/234 |

FOREIGN PATENT DOCUMENTS 2081465 2/1982 United Kingdom ............... 430/234

OTHER PUBLICATIONS

Abstract of Japan, 150849/82, Kokai.

Primary Examiner—Won H. Louie
Attorney, Agent, or Firm—Cushman, Darby & Cushman

[57] ABSTRACT

Disclosed is a light-sensitive photographic element for negative type lithographic printing plates high in sensitivity and contrast which comprises a support having thereon a light-sensitive silver halide, a metal salt particle having substantially no light-sensitivity, a compound which reacts with an oxidized developing agent produced by development to release a compond which acts as a solvent or a solution physical development accelerator for said metal salt particle and physical development nuclei.

19 Claims, No Drawings

NEGATIVE TYPE LITHOGRAPHIC PRINTING PLATE

BACKGROUND OF THE INVENTION

This invention relates to a method for making a negative type lithographic printing plate using a novel method for forming images by negative type silver complex diffusion transfer processes.

It is well known that a silver image is produced by silver complex diffusion transfer processes and is used as a lithographic printing plate by subjecting the silver images to oleophilization treatment.

That is, according to the above method, a silver halide emulsion layer coated on a support is imagewise exposed and then treated with a processing solution containing a developer and a silver halide solvent to reduce exposed silver halide to non-clustered silver and to dissolve unexposed silver halide by the action of the silver halide solvent, which is precpiitated as a physical developed clustered silver on physical development nuclei provided in contact with the emulsion layer and thus obtained positive silver image is made oleophilic whereby this can be directly used as a lithographic printing plate. This technique is disclosed, e.g., in Japanese Patent Publication (Kokoku) Nos. 10910/61, 18719/61, 30562/73, etc.

However, the printing plates made by methods of plate making using the above diffusion transfer process are positive type printing plates and so these methods cannot be used for making lithographic printing plates directly from negative originals.

Furthermore, theoretically, negative type is more useful than positive type for direct plate making by laser scanners which are recently widely employed.

On the other hand, there have been known only a few methods for making lithographic printing plates with use of a negative type silver complex diffusion transfer process. One of them recently proposed is disclosed in Japanese Patent Laid-Open Application (Kokai) No. 44153/82 according to which non-light-sensitive easily-soluble metal salt particles coated with an insolubilizing agent are dissolved out by the physicochemical action caused by development of light-sensitive silver halide in the exposed areas to form a metallic image, which is made oleophilic. Improvement of this method is disclosed in Japanese Patent Laid-Open Application (Kokai) No. 150849/82. However, in these methods a metal salt particle coated with an insolubilizing agent is used as a negative image forming material and therefore the image forming speed on developing is low and moreover since the light-sensitive material contains an insolubilizing agent for the metal salts in a large amount, the storage property of the material is badly influenced.

SUMMARY OF THE INVENTION

It is therefore an object of this invention to provide a novel negative type lithographic printing plate high in sensitivity and contrast and excellent in the storage property.

A further object of this invention is to improve the inherent problem of the said printing plates that fogging may be brought about if even only a small amount of oxidized developing agent produced by air oxidation, etc. is present in the system.

DESCRIPTION OF THE INVENTION

These objects of this invention are accomplished by the method for making negative type lithographic printing plates which includes the steps of imagewise exposing a light-sensitive photographic element comprising a support having thereon a combination of (1) a light-sensitive silver halide, (2) a substantially non-light-sensitive metal salt particle, (3) a compound which reacts with an oxidized developing agent produced by development to release a compound which acts as a solvent or a solution physical development accelerator for said metal salt particle (2) and (4) physical development nuclei and then developing the light-sensitive element to selectively precipitate said metal salt particle (2) in the exposed areas on said physical development nuclei (4) as metallic images.

That is, when the light-sensitive photographic element of this invention is exposed imagewise and then is developed, development of the light-sensitive silver halide (1) occurs in the exposed areas to produce an oxidized developing agent, which further reacts with the compound (3) which releases a compound which acts as a solvent or a solution physical development accelerator for the metal salt particle, thereby to dissolve the metal salt particle (2) or to accelerate the solution physical development of the metal salt particle (2) whereby a metallic image is negatively precipitated on the physical development nuclei (4). This image is normally a mirror-surface dense metal aggregate layer and has ink-receptivity. Therefore, the light-sensitive photographic element of this invention can be made to a negative type lithographic printing plate by carring out said treatments.

The light-sensitive photographic element according to this invention not only accomplishes the objects enumerated above, but is excellent in transfer efficiency of the metal to physical development nuclei. Therefore, it has the advantage that saving of silver can be attained when non-light-sensitive silver halide is used as the metal salt particle.

According to another more preferred embodiment of this invention, the light-sensitive photographic element containing the combination of (1) to (4) further contains an electron donor compound (E) having an oxidation potential lower than that of the compound (3) in a buffer solution (25° C.) having a pH of 13.0. That is, when this light-sensitive photographic element is exposed imagewise and then developed, the metallic image is formed in the exposed area as mentioned above. On the other hand, since a suitable amount of theelectron donor compound (E) having an oxidation potential lower than that of compound (3) at a pH of 12.0 to 14.0 which is the ordinary developing condition is contained in the element, a slight amount of the oxidized developing agent produced by air oxidation or the like in the unexposed areas selectively reacts with the compound (E) and is reduced and so no reaction of the oxidized developing agent with the compound (3) occurs to cause no fogging. In the exposed areas, amount of the oxidized developing agent produced is large and hence initiation of reaction of compound !3) is not prevented. Therefore, augmentation action of the development occurs in nearly the same manner as when compoudn (E) is not contained and so the photographic element can be used as a negative type lithographic printing plate by carrying out said treatments.

The light-sensitive silver halides (1) used in this invention include silver chloride, silver bromide, silver iodide, silver chlorobromide, silver chloroiodide, silver iodobromide, silver chloroiodobromide and the like. Mixtures of more than one of such silver halides may also be used. Of these silver halides a high speed silver bromide or a silver iodobromide containing 10 mol % or less of silver iodide are suitable for this invention. The photographic emulsions containing silver halides used in this invention may be prepared by the usually employed methods. The silver halide grains used in this invention may have various crystal habits. These silver halide emulsions may be sensitized with various chemical sensitizers, spectrally sensitized with sensitizing dyes to provide sensitivity for desired spectral ranges or stabilized with various stabilizers.

The non-light-sensitive metal salt particle (2) used in this invention is a salt of a metal which has a higher dissolution speed for the solvents which are released from compound (3) than the light-sensitive silver halide (1) and which has substantially no light-sensitivity. The words "has substantially no light-sensitivity" here means that the metal salt particle is non-light-sensitive in correlation with said light-sensitive silver halide (1) and specifically means that when a light energy necessary to expose to the light-sensitive silver halide (1) is applied to the light-sensitive photographic elements of this invention, the metal salt particle is not substantially exposed to said light energy. In this invention, the word "non-light-sensitive" is also used in the same meaning as above.

The non-light-sensitive metal salt particle (2) used in this invention may be selected from those having the above properties, but for a preferred embodiment of this invention the particle (2) is a silver halide particle having substantially no light-sensitivity. This silver halide particle is selected from those having higher dissolution speed for the solvent than that of the light-sensitive silver halide particle (1).

More specifically, the metal salt particle which may be preferably used is pure silver chloride not chemically sensitized or a desensitized silver chlorobromide containing not more than 5 mol % of silver bromide or a desensitized silver chloroiodide containing not more than 1 mol % of silver iodide or mixed silver halides thereof. These silver halides are preferably of crystal finer than the light-sensitive silver halide (1). The metal salt particle is used in an amount of 0.1 mol to 100 mols. preferably 1 mol to 10 mols per 1 mol of light-sensitive silver halide (1).

The compound (3) which releases a solvent or solution physical development accelerator [called "SRR compound" (solvent releasing redox compound) hereinafter] means a compound represented by the following general formula:

A—B           [I]

In the formula [I], A represents a redox release carrier moiety which is oxidized by cross-oxidation with an oxidized developing agent and releases residue group B by the subsequent hydrolysis reaction under alkaline conditions and B represents a substituent which produces a compound having a dissolving action or solution physical development accelerating action for the metal salt particle upon being released from A. A may have a ballast group for immobilizing A in the photographic elements. A is preferably a redox release carrier moiety of diffusible dye releasing redox compounds (called "DRR compound" hereinafter) which act negatively and are known in color diffusion transfer processes.

More specifically, A is preferably a substituted phenol, a substituted naphthol or, a substituted indole which bonds to B through sulfonamide group as shown by the following formulas ①-③.

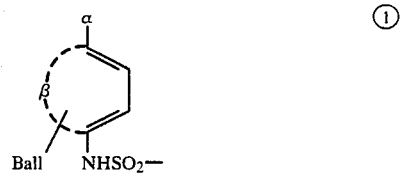         ①

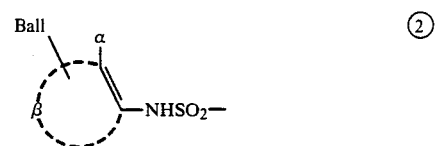         ②

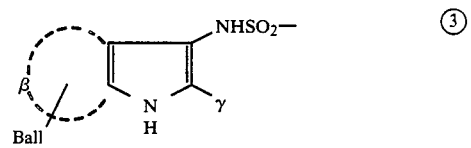         ③

In the above formulas, α represents hydroxyl group or a group which affords hydroxyl group upon hydrolysis and β represents atom group necessary to form a carbon ring, e.g., benzene ring, which may be condensed with carbon ring or hetero ring to form, e.g., naphthalene ring, quinoline ring or the like, γ represents an alkyl, alkoxy or aryl substituent and Ball represents an organic ballast group which is preferably a group including a hydrophobic group of 8 to 50 carbon atoms. In the compound ③, a ballast group may be substituted at the position of γ.

The mechanism of release of residue B by development is the same as that of release of dyes of DRR compound in the color diffusion transfer processes and is mentioned in detail in Angew, Chem. Int. Ed. Engl. Vol. 22, Pages 191-209 (1983) and "Organic Synthetic Chemistry" Vol. 39, No. 4, Pages 331-344 (1981). As the residue B there may be generally used substituents which form compounds exhibiting the dissolving action or solution physical development accelerating action for the metal salt particle which are known in the field of silver halide photographic materials. More preferred are heterocyclic compounds such as substituted uracil, substiuted hydantoin, substituted imidazolidinethion, substituted thiazolidinethion, substituted oxazolidinethion and the like and substituted chain thioethers, substituted amino-alcohol, etc. which bonds to the redox release carrier moiety of said DRR compound through sulfonamide which are known as silver halide solvent or solution physical development accelerators for silver halides in the field of silver salt light-sensitive materials.

Examples of the SRR compounds [I] are enumerated below.

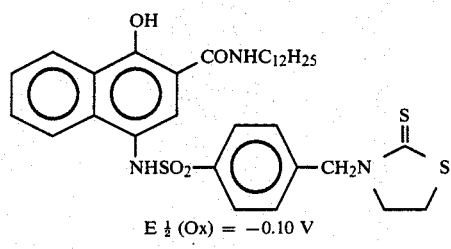

SRR-1.

$E\frac{1}{2}$ (Ox) = −0.10 V

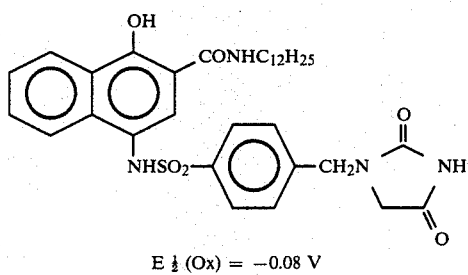

SRR-2.

$E\frac{1}{2}$ (Ox) = −0.08 V

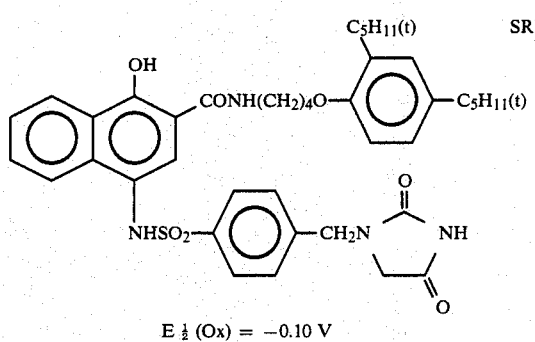

SRR-3.

$E\frac{1}{2}$ (Ox) = −0.10 V

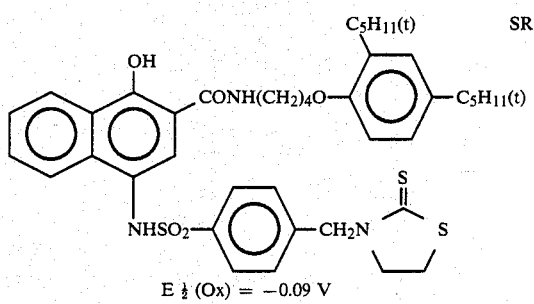

SRR-4.

$E\frac{1}{2}$ (Ox) = −0.09 V

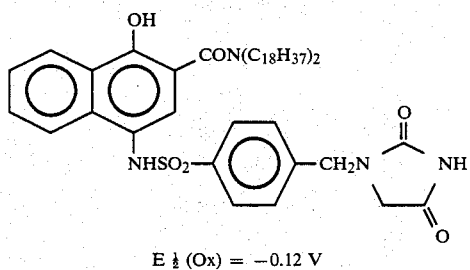

SRR-5.

$E\frac{1}{2}$ (Ox) = −0.12 V

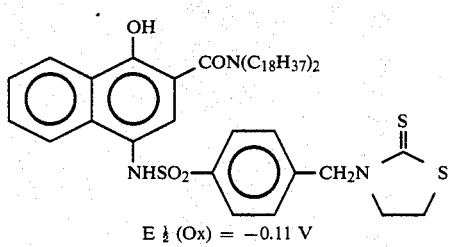

SRR-6.

$E\frac{1}{2}$ (Ox) = −0.11 V

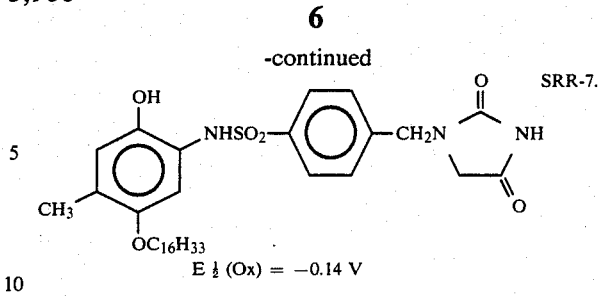

SRR-7.

$E\frac{1}{2}$ (Ox) = −0.14 V

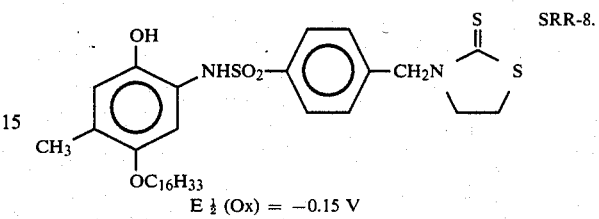

SRR-8.

$E\frac{1}{2}$ (Ox) = −0.15 V

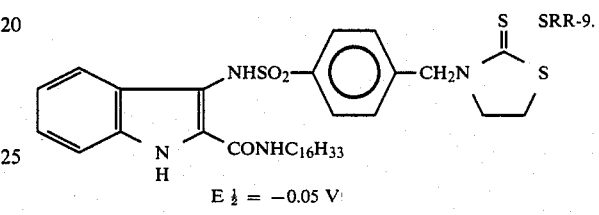

SRR-9.

$E\frac{1}{2}$ = −0.05 V $E\frac{1}{2}$ (Ox) which is an oxidation half wave potential of compounds SRR-1 to SRR-9 was measured by cyclic voltammetry method using a saturated calomel electrode as a reference electrode in a buffer solution (25° C.) of pH=13.0. The sample concentration at the measurement was $10^{-3}$ to $10^{-4}$ mol/l.

These compounds may be used along or in combination of two or more. When the compound [I] is used as the compound which releases the solvent or solution physical development accelerator, any developing agents which are used for development of ordinary silver halide photographic materials and which form an oxidation product capable of cross-oxidizing the redox release carrier moiety A in [I] may be used. Preferred are 1-phenyl-3-pyrazolidinone derivatives commonly used as a cross-oxidizing agent (or an electron transfer agent) in color diffusion transfer light-sensitive materials. The developing agent may be contained in a processing solution or in the photographic materials.

The physical development nuclei (4) used in this invention are substances having an action of catalytically accelerating the reaction of reduction of metal ion or metal complex ion produced by dissolution of the metal salt particle (2) with a reducing agent to metals. Examples of these substances are metal sulfide colloids, noble metal colloids and the like. More specifically, palladium sulfide, nickel sulfide, silver sulfide or metallic silver colloid, metallic palladium colloid, etc. may be preferably used.

The component (E) in more preferred embodiment of this invention, namely, the electron donor compound (E) having an oxidation potential lower than that of the compound (3) in a buffer solution (25° C.) of pH=13.0 may be various compounds depending on selection of compounds (3). As preferable examples, mention may be made of the compounds having the so-called reducibility which have a low oxidation potential in an alkaline aqueous solution such as substituted hydroquinones, substituted catechols, 1,4- or 1,2-dihydroxynaphthalenes having various substituents such as alkyl, aryl, allyl, alkoxy, etc., substituted aminophenols, substituted phenylenediamines, and the like. Furthermore, these compounds may have ballast group as the substituent for immobilization in the photographic elements.

When SRR-1 is used as the compound (3), the following compounds are preferred to be used as compound (E), but it should be noted that this invention is never limited to these compounds.

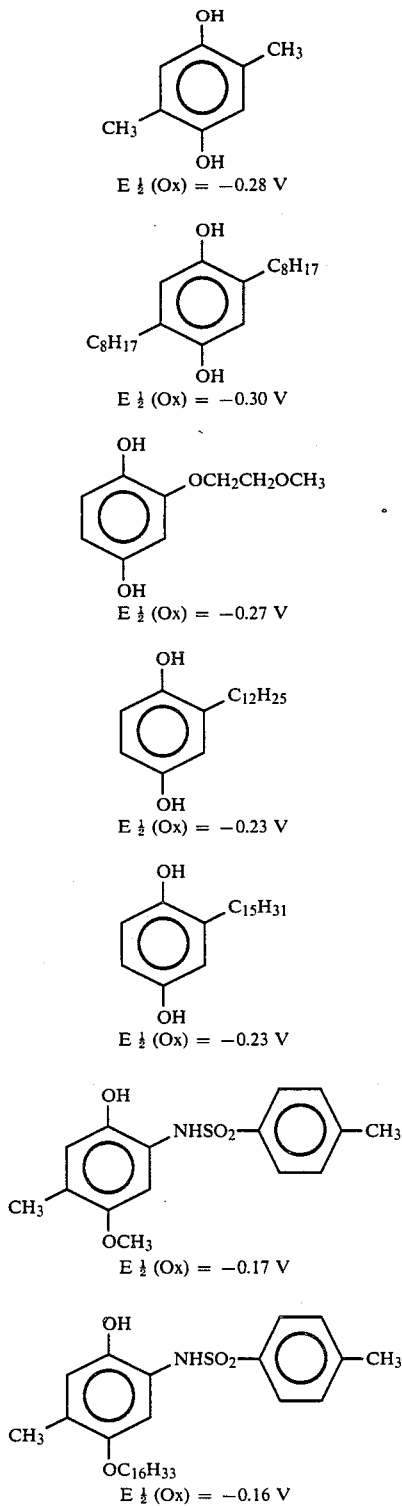

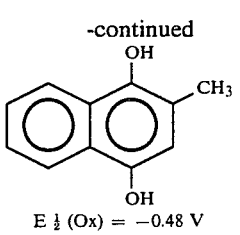

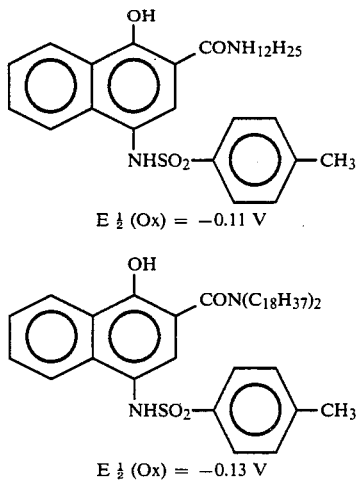

The oxidation half wave potentials $E_{\frac{1}{2}}$ (Ox) of compounds 1 to 10 were measured by cyclic voltammetry method in a buffer solution (25° C.) of pH=13.0 using a saturated calomel electrode as a reference electrode. Sample concentration at the measurement was $10^{-3}$ to $10^{-4}$ mol/l.

These compounds may be used in the range of 0.01 to 100 mols per mol of compound (3). Moreover, these compounds may be used along or in combination of two or more.

The photographic light-sensitive elements according to this invention basically comprise at least one support and a combination of (1) a light-sensitive silver halide, (2) a metal salt particle having substantially no light-sensitivity, (3) a compound which reacts with an oxidized developing agent produced by development to release a compound which acts as a solvent or a solution physical development accelerator for the metal salt particle (2) and (4) physical development nuclei. Each of these components (1), (2), (3) and (4) may be contained respectively in a single layer or two or more of them are contained in combination. Moreover, the layer may be in any sequence. Furthermore, the components (1), (2), (3) and (4) may be present separately on two supports in optional combination and in optional layer structure and these two may be used in contact with each other.

Especially preferred layer construction for the silver halide photographic elements is two-layer construction which comprises on a support a layer of the mixture of the solvent releasing compound, the light-sensitive silver halide particle and the metal salt particle and a physical development nuclei layer provided on said layer or three-layer construction which comprises on a support a layer comprising a mixture of the solvent releasing compound and the light-sensitive silver halide, a layer containing only the metal salt particle on said layer and furthermore the physical development nuclei layer on said metal salt particle layer.

Similarly, in the case of containing the compound (E), especially preferred layer construction is two-layer construction comprising on a support a layer of the mixture of (1), (2), (3) and (E) and a layer of (4) on said layer of the mixture, three-layer construction comprising on a support a layer of a mixture of (1), (3) and (E), a layer containing (2) thereon and a layer of (4) thereon or three-layer construction comprising on a support a layer of (1), a layer of (2), (3) and (E) thereon and a layer of (4) thereon.

Other photographic additives may be added to optional layers of the photographic elements of this invention depending on the objects as long as the effects of this invention are not damaged. In order to improve or increase especially printing characteristics such as water retention characteristic, printing endurance, etc., for example, silica gel, colloidal silica, silicon dioxide, magnesium oxide, titanium dioxide, calcium carbonate, etc. may be added as fine powders to optional layers. In order to improve adhesion of the layers to the support and film properties, there may be used hardeners commonly used in the field and in order to improve coating stability of coating liquid there may be used surfactants.

Any supports which have hydrophilic surface may be used in this invention.

These supports include, for example, baryta papers, polyethylene coated papers, cellulose acetate films, polyester films such as polyethylene terephthalate, polyamide films, polystyrene films, glass plates which have been subjected to corona treatment or subbing treatment or metal plates such as anodized aluminum plates. Especially preferred are polyethylene coated papers, polyester films or aluminum plates. The hydrophilization treatments of surface such as said corona treatment, subbing treatment, and anodizing treatment may be carried out by the processes commonly employed in this field.

This invention is further illustrated in the following Examples.

EXAMPLE 1

(a) Preparation of a high speed silver iodobromide emulsion (preparation of light-sensitive silver halide emulsion):

A silver iodobromide emulsion (containing 2 mol % of silver iodide) was prepared from silver nitrate, potassium bromide and potassium iodide by the ordinary neutral rethod. The emulsion was chenically sensitized by gold and sulfur sensitizing method and thereto was added 4-hydroxy-6-methyl-1,3,3a, 7-tetrazaindene as a stabilizer to obtain silver iodobromide emulsion of $0.4\mu$ in diameter.

(b) Preparation of desensitized silver iodochloride emulsion (prepration of non-light-sensitive metal salt particle):

A desensitized silver iodochloride emulsion (containing 0.8 mol % of silver iodide) was prepared using silver nitrate, sodium chloride, and potassium iodide and rhodium chloride as a desensitizer. Thus obtained emulsion particles had a particle diameter of $0.1\mu$.

(c) Preparation of physical development nuclei:

Physical development nuclei comprising silver sulfide were prepared from sodium sulfide and silver nitrate in an aqueous polyvinyl alcohol solution.

Thus prepared (a) high speed silver iodobromide emulsion, (b) desensitized silver iodochloride emulsion and (c) physical development nuclei and (d) a gel prepared by containing in gelatin the silver halide solvent releasing redox compound (1) (SRR-1) exemplified above by oil dispersion method were coated on a paper support in the following manner to obtain the samples of this invention and the comparative samples as shown below.

Sample 1-1 (The sample of this invention):
This sample consisted of the support, a layer containing (a) and (d) coated on the support, a layer containing (b) coated on said layer and a layer containing (c) coated on said layer of (b).

Sample 1-2 (Comparative sample):
This sample consisted of the support, a layer containing (a) and (d) coated on the support and a layer containing (b) coated on said layer.

Sample 1-3 (Comparative sample):
This sample consisted of the support, a layer containing (a) and (d) coated on the support and a layer containing (c) coated on said layer.

Sample 1-4 (Comparative sample):
This sample consisted of the support and a layer containing (a) and (d) coated on the support.

Sample 1-5 (Comparative sample):
This sample consisted of the support, a layer containing (a) coated on the support, a layer containing (b) coated on said layer and a layer containing (c) coated on said layer (b).

Sample 1-6 (Comparative sample):
This sample consisted of the support, a layer containing (a) coated on the support, and a layer containing (b) coated on said layer.

Sample 1-7 (Comparative sample):
This sample consisted of the support, a layer containing (a) coated on the support and a layer containing (c) coated on said layer.

Sample 1-8 (Comparative sample):
This sample consisted of the support, a layer containing (d) coated on the support, a layer containing (b) coated on said layer and a layer containing (c) coated on said layer (b).

Sample 1-9 (Comparative sample):
This sample consisted of the support, a layer containing (d) coated on the support and a layer containing (b) coated on said layer.

Sample 1-10 (Comparative sample):
This sample consisted of the support, a layer containing (b) coated on the support and a layer containing (c) coated on said layer.

Sample 1-11 (Comparative sample):
This sample consisted of the support and a layer containing (a) coated on the support.

Sample 1-12 (Comparative sample):
This sample consisted of the support and a layer containing (b) coated on the support.

In these samples, (c) was coated so that coating amount of silver sulfide was $6 \times 10^{-6}$ mol/m$^2$ and (d) was coated so that coating amount of the compound (1) was 1.3 g/m$^2$. Coating amounts of (a) and (b) are shown in Table 1.

These samples were wedge-exposed with a light of 4.5 CMS and thereafter developed with the following developing solutions [A] at 20° C. for 1.5 minutes.

| [A] Developing solution | |
|---|---|
| 1-phenyl-3-pyrazolidone | 10 g |
| Sodium hydroxide | 20 g |
| Anhydrous sodium sulfite | 50 g |
| Benzyl alcohol | 15 ml |

-continued

| [A] Developing solution | |
|---|---|
| Benzotriazole | 0.25 g |
| Water to make up | 1 l |

After the development, the samples were fixed with a fixing solution KODAK F-5 (manufactured by Eastnan Kodak Co.) and then amount of silver in each sample was measured to obtain the results as shown in Table 1.

TABLE 1

| Samples | Coating amount of silver (g/m$^2$) | | Wedge maximum-exposed areas | | Unexposed areas Amount of fog silver (g/m$^2$) |
|---|---|---|---|---|---|
| | (a) | (b) | Amount of development silver (g/m$^2$) | Percentage of development silver in (b) (%) | |
| 1-1 (This invention) | 0.15 | 0.37 | 0.46 | 84 | 0.09 |
| 1-2 (Comparative) | 0.15 | 0.37 | 0.17 | 5 | 0.08 |
| 1-3 (Comparative) | 0.15 | — | 0.15 | — | 0.08 |
| 1-4 (Comparative) | 0.15 | — | 0.15 | — | 0.07 |
| 1-5 (Comparative) | 0.15 | 0.37 | 0.16 | 3 | 0.05 |
| 1-6 (Comparative) | 0.15 | 0.37 | 0.17 | 5 | 0.05 |
| 1-7 (Comparative) | 0.15 | — | 0.15 | — | 0.03 |
| 1-8 (Comparative) | — | 0.37 | 0.02 | 5 | 0.02 |
| 1-9 (Comparative) | — | 0.37 | 0.01 | 3 | 0.01 |
| 1-10 (Comparative) | — | 0.37 | 0.02 | 5 | 0.02 |
| 1-11 (Comparative) | 0.15 | — | 0.15 | — | 0.02 |
| 1-12 (Comparative) | — | 0.37 | 0.01 | 3 | 0.01 |

A mirror-surface silver was precipitated in the exposed areas of the wedge only in Sample 1-1 of this invention.

As is clear from these results only the method of this invention can afford a negative mirror-surface silver image of superior transfer efficiency in spite of low coating amount of silver.

Then, the surface of thus obtained Sample 1-1 of this invention was wiped with a oleophilizing solution (SLM-OH solution made by MITSUBISHI PAPER MILLS CO., LTD) to make it oleophilic and then the sample was immersed in a water bath to allow the surface of the sample to contain water.

Thereafter, the surface was rubbed by a rubber roller applied with a common offset printing ink and as a result the ink adhered to only the exposed areas where mirror-surface silver image was formed. A paper was put on the surface and was pressed by a rubber roller to obtain an ink image on the paper.

From the above, it is recognized that the method of this invention affords a novel negative type lithographic printing plate.

EXAMPLE 2

An emulsion prepared by mixing the same high speed silver iodobromide emulsion (a) as used in Example 1 and a gelatin gel in which the same silver halide solvent releasing redox compound (1) as used in Example 1 was dispersed as (d) was coated on a paper support in such amounts that the coating amount of (a) was 0.4 g/m$^2$ in terms of silver and that of (d) was 1.3 g/m$^2$ in terms of the compound (1). Thereon was coated an emulsion prepared by mixing the same desensitized silver iodochloride emulsion (b) as used in Example 1 and silica gel powder (e) (SYLOID SY-308 manufactured by Fuji Davison Chemical Co.) so that coating amount of (b) was 0.8 g/m$^2$ in terms of silver and that of (e) was 1.0 g/m$^2$. Furthermore thereon was coated the same Physical development nuclei (c') which comprised palladium sulfide and were prepared from palladium chloride and sodium sulfide by the method as in Example 1 was coated in such a coating amount as $3 \times 10^{-5}$ mol/m$^2$ in terms of palladium sulfide.

Thus produced Sample 2 of the three layer structure according to this invention was exposed, developed and fixed and then the surface was made oleophilic in the same manner as in Example 1 to obtain a printing plate. This printing plate was mounted on an offset printing machine and printing was carried out using a common offset printing ink and normal water as a fountain solution to obtain clear ink images. Printing endurance of this plate was high namely, more than 500 copies could be printed therewith. Furthermore, no stains with ink occurred.

From the above, it will be recognized that this invention is a method for making excellent negative type lithographic printing plates.

EXAMPLE 3

An emulsion prepared by mixing the same high speed silver iodobrimide (a) and desensitized silver iodochloride emulsion (b) as used in Example 1 with a gel prepared by containing in gelatin the above exemplified silver halide solvent releasing compounds (3) and (4) as (d) by oil dispersing method and the same silica gel powder (e) as used in Example 2 was coated on a polyethylene terephthalate film. Coating amount of (a) was 0.4 g/m$^2$ in terms of silver, that of (b) was 0.8 g/m$^2$ in terms of silver, that of (d) was 0.7 g/m$^2$ of compound (3) and 0.7 g/m$^2$ of compound (4) and that of (e) was 1.0 g/m$^2$.

On thus coated emulsion monolayer was coated the same physical development nuclei as used in Example 2 in such an amount that coating amount of palladium sulfide was $3 \times 10^{-5}$ mol/m$^2$ to obtain Sample 3 of two-layer construction of this invention.

This Sample 3 was exposed in the same manner as in Example 1, then developed with the developing solution [A] of Example 1 at 20° C. for 45 seconds, and fixed and thereafter the surface was made oleophilic by the deoleophilizing solution used in Example 1 to obtain a printing plate.

Thus obtained printing plate was mounted on an offset printing machine and printing was carried out as in Example 2 to obtain clear images free from ink stains. More than 500 copies could be printed therewith.

From the above, it will be recognized that this invention is a method for making excellent negative type lithographic printing plates requiring short processing time.

EXAMPLE 4

The following sample of this invention and comparative samples were produced by using a paper support and (5) a gel prepared by containing the above exemplified electron donor compound 5 in gelatin by oil dispersion method in addition to the components (a), (b), (c') and (d) as prepared in Exaxple 2 except that SRR compound 6 was used in place of SRR-1 as (d).

Sample 4-1 (Sample of this invention):
This sample consisted of a layer containing (a), (d) and (f) on the support, a layer containing (b) coated on said layer and a layer containing (c') coated on said layer (b).

Sample 4-2 (Sample of this invention):
This sample consisted of a layer containing (a) and (d) coated on the support, a layer containing (b) coated on said layer and a layer containing (c') coated on said layer (b).

Sample 4-3 (Comparative sample):
This sample consisted of a layer containing (a) and (f) coated on the support, a layer containing (b) coated on said layer and a layer containing (c') coated on said layer (b).

Sample 4-4 (Comparative sample):
This sample consisted of a layer containing (a) coated on the support, a layer containing (b) coated on said layer and a layer containing (c') coated on said layer (b).

In these samples, coating amount of the high speed silver iodobromide emulsion (a) was 0.13 g/m$^2$ in terms of silver, that of the desensitized silver iodochloride (b) was 0.42 g/m$^2$ in terms of silver, that of palladium sulfide (c') was $6\times10^{-6}$ mol/m$^2$, that of SRR compound (SRR-6) (d) was 0.4 millimol/m$^2$ and that of the electron donor compound (compound 5) (f) was 0.32 millimole/m$^2$.

These samples were wedge-exposed with a light of 4.5 CMS and then developed with a developing solution having the following composition.

| | | |
|---|---|---|
| 1-Phenyl-3-pyrazolidone | 10 | g |
| Sodium hydroxide | 20 | g |
| Anhydrous sodium sulfite | 50 | g |
| Benzotriazole | 0.25 | g |
| Benzyl alcohol | 15 | ml |
| Water to make up | 1000 | ml |

After the development, the samples were fixed with Kodak F-5 fixing solution (manufactured by Eastman Kodak Company), washed with water and dried. Then, amount of silver in each sample was measured to obtain the results as shown in Table 2.

TABLE 2

| Samples | Exposed areas Amount of development silver (g/m$^2$) | Exposed areas Amount of development silver of (b) (%) | Unexposed areas Amount of Fog silver (g/m$^2$) | Fog (%) |
|---|---|---|---|---|
| 4-2 (This invention) | 0.49 | 86 | 0.05 | 9 |
| 4-2 (Comparative) | 0.48 | 83 | 0.15 | 27 |
| 4-3 (Comparative) | 0.14 | 2 | 0.04 | 7 |
| 4-4 (Comparative) | 0.13 | 0 | 0.03 | 5 |

A mirror-surface silver was precipitated in the exposed areas of Sample 4-1 and Sample 4-2 while no silver was precipitated in the exposed areas of Sample 4-3 and Sample 4-4. No precipitated silver was seen on the surface of unexposed areas of Sample 4-1 while some precipitated silver due to fogging was seen in the unexposed areas of Sample 4-2.

From the above results, it will be recognized that the method of this invention can afford negative mirror-surface silver images having substantially no fog in the unexposed areas and excellent in the silver transfer efficiency. It will also be recognized that the electron donor compound (f) alone does not act and exhibits the effect only in the coexistence of (f) with (d).

Next, the surface of the above Sample 4-1 of this invention and the comparative Sample 4-2 was made oleophilic by wiping the surface with SLM-OH solution (oleophilizing solution manufactured by MITSUBISHI PAPER MILLS LTD.) and then was immersed in a water bath for 3 minutes to allow the surface to contain water. Thereafter, the surface was rubbed with a rubber roller applied with a ordinary offset printing ink to find that the ink adhered to only the exposed areas where the mirror-surface silver images were formed in Sample 4-1 while some ink adhered to the unexposed areas besides the exposed area in Sample 4-2.

A paper was put on the surface of these samples and pressed by a rubber roller to transfer ink images to the paper. In the case of Sample 4-1 there were obtained clear images free of ink stain in the unexposed areas while in the case of Sample 4-2, considerable ink stain was seen in the unexposed areas.

From the above it will be recognized that the method of this invention can afford novel negative type lithographic printing plates free of fogs.

EXAMPLE 5

An emulsion prepared by mixing the same high speed silver iodobromide emulsion (a) as used in Example 4, the same gelatin gel in which SRR-6 (d) was oil dispersed as used in Example 4 and the same gelatin gel in which the electron donor compound 4 as (e) as used in Example 4 was oil dipsersed was coated on a paper support. Coating amount of (a) was 0.3 g/m$^2$ in terms of silver, that of SRR-6 of (d) was 0.6 millimole/m$^2$ and that of the electron donor compound 5 of (f) was 0.48 millimol/m$^2$. On this layer was coated an emulsion prepared by mixing the same desensitized silver iodochloride emulsion (b) as used in Example 4 and (e) SYLOID SY-308 (silica gel powder manufactured by Fuji Davison Chemical Co.). coating amount of (b) was 0.7 g/m$^2$ in terms of silver and that of (e) was 1.0 g/m$^2$.

Furthermore, on this layer was coated the same physical development nuclei (c') as used in Example 4 so that coating amount of palladium sulfide was $3\times10^{-5}$ mol/m$^2$.

Thus produced Sample 5 of three-layer construction of this invention was exposed, developed and fixed and then the surface was made oleophilic in the same manner as in Example 4 to obtain a printing plate.

This printing plate was mounted on an offset printing machine and printing was carried out with an ordinary offset printing ink and normal water as a fountain solution to obtain clear ink image free of ink stain in the unexposed areas. More than 500 copies could be printed with this printing plate.

From the above, it will be recognized that this invention provides an excellent method for making negative type lithographic printing plates.

EXAMPLE 6

A sample of the same layer construction and the same coating amounts as in Example 5 was produced in the same manner as in Example 5 except that a polyethylene terephthalate film was used as the support, SRR-8 (coating amount: 0.6 millimol/m$^2$) was used in place of SRR-6 of (d) and the electron donor compound 2 was used in Sample 6-1, the electron donor compound 4 was used in Sample 6-2 and, the electron donor compound 5 was used in Sample 6-3. These Samples 6-4~6-3 were developed with the same developing solution as used in Example 4 at 20° C. for 60 seconds and then was fixed in the same manner as in Example 4 and the surface was made oleophilic to obtain printing plates.

Printing was carried out with these printing plates in the same manner as in Example 5 to obtain clear images free of ink stain. More than 500 copies could be printed with these printing plates.

From the above, it will be recognized that this invention provides a method for making excellent negative type lithographic printing plates.

What is claimed is:

1. A light-sensitive photographic element for negative lithographic printing plates which comprises a support having thereon (1) a light-sensitive silver halide, (2) a metal salt particle having substantially no light-sensitivity, (3) a compound which reacts with an oxidized developing agent produced by development to release a compound which acts as a solvent or a solution physical development accelerator for said metal salt particle (2) and (4) physical development nuclei, which compound (3) has the formula:

$$A-B \qquad [I]$$

wherein A represents a redox release carrier moiety which is oxidized by cross-oxidation with the oxidized developing agent and releases residue B by the subsequent hydrolysis under alkaline condition and B represents a substituent which produces a compound having dissolving action or solution physical development acceleration action for the metal salt particle upon being released from A.

2. A light-sensitive photographic element according to claim 1 wherein the metal salt particle (2) is a silver halide having substantially no light-sensitivity.

3. A light-sensitive photographic element according to claim 2 wherein the silver halide is a pure silver chloride not chemically sensitized or a desensitized silver chlorobromide containing 5 mol % or less of silver bromide or a desensitized silver chloroiodide containing 1 mol % or less of silver iodide or a mixture thereof.

4. A light sensitive photographic element according to claim 1 wherein amount of the silver salt particle (2) is 0.1 to 100 mols per mol of the light-sensitive silver halide (1).

5. A light-sensitive photographic element according to claim 1 wherein A in the formula [I] is a redox release carrier moiety of diffusible dye releasing redox compounds.

6. A light-sensitive photographic element according to claim 1 wherein A is a substituted phenol, a substituted naphthol or a substituted indole which bonds to B through a sulfonamide group and which is represented by one of the following formulas ① to ③ :

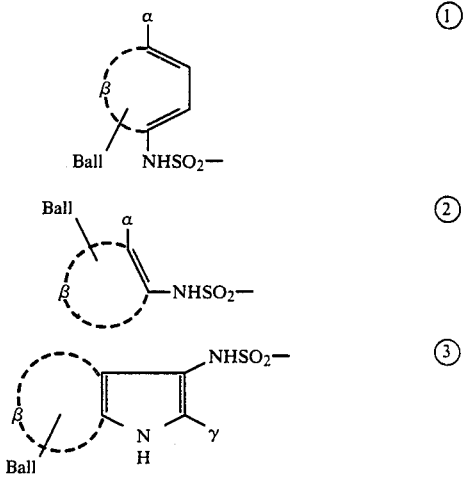

wherein α represents hydroxyl group or a group which gives hydroxyl group upon hydrolysis, β represents an atom group necessary to form a carbon ring which may be condensed with a carbon ring or a hetero ring, γ represents an alkyl, an alkoxy or an aryl substituent and Ball represents an organic ballast group.

7. A light-sensitive photographic element according to claim 1 wherein the residue B is a substituted uracil, substituted hydantoin, substituted imidazolidinethion, substituted thiazolidinethion, substituted oxazolidinethion, substituted chain thioether, or substituted aminoalcohol.

8. A light-sensitive photographic element according to claim 1 which additionally contains an electron donor compound (E) having an oxidation potential lower than the compound (3) in a buffer solution (25° C.) of pH=13.0.

9. A light-sensitive photographic element according to claim 8 wherein the electron donor compound (E) is a substituted hydroquinone, substituted catechol, substituted 1,4- or 1,2-dihydroxynaphthalene, substituted aminophenol or substituted phenylenediamine.

10. A light-sensitive photographic element according to claim 8 wherein amount of theelectron donor compound (E) is 0.01 to 100 mol per mole of the compound (3).

11. A light-sensitive photographic element according to claim 1 wherein each of the components (1), (2), (3) and (4) is contained in a single layer, respectively or in combination of two or more.

12. A light-sensitive photographic element according to claim 11 which comprises a layer of the components (1), (2) and (3) coated on a support and a layer of the component (4) coated on said layer.

13. A light-sensitive photographic element according to claim 11 which comprises a layer of the components (1) and (3) coated on a support, a layer of the component (2) coated thereon and a layer of the component (4) further coated thereon.

14. A light-sensitive photographic element according to claim 8 wherein the components (1) to (4) and (E) are separately contained in each layer or contained in combination of two or more.

15. A light-sensitive photographic element according to claim 14 which comprises a layer of the components (1), (2) (3) and (E) coated on a support and a layer of the component (4) coated thereon.

16. A light-sensitive photographic element according to claim 14 which comprises a layer of the components (1), (3) and (E) coated on a support, a layer of the component (2) coated thereon and a layer of the component (4) coated on the layer of the component (2).

17. A light-sensitive photographic element according to claim 14 which comprises a layer of the component (1) coated on a support, a layer of the components (2), (3) and (E) coated thereon and a layer of the component (4) coated thereon.

18. A method for making a negative type lithographic printing plate which comprises imagewise exposing the light-sensitive photographic element according to claim 1 and then developing the exposed element to produce metallic images.

19. A method for making a negative type lithographic printing plate which comprises imagewise exposing the light-sensitive photographic element according to claim 14 and then developing the exposed element to produce metal images.

* * * * *